US010965897B2

(12) United States Patent
Kim (10) Patent No.: US 10,965,897 B2
(45) Date of Patent: Mar. 30, 2021

(54) COMPARISON DEVICE AND CMOS IMAGE SENSOR INCLUDING THE SAME (71) Applicant: SK hynix Inc., Icheon-si (KR)

(72) Inventor: Hyeon-June Kim, Yeosu-si (KR)

(73) Assignee: SK hynix Inc., Icheon-si (KR)

(*) Notice: Subject to any disclaimer, the term of this patent is extended or adjusted under 35 U.S.C. 154(b) by 0 days.

(21) Appl. No.: 16/219,099

(22) Filed: Dec. 13, 2018

(65) Prior Publication Data

US 2019/0253650 A1   Aug. 15, 2019

(30) Foreign Application Priority Data

Feb. 13, 2018   (KR) .................. 10-2018-0017463

(51) Int. Cl.
| H04N 5/357 | (2011.01) |
| H04N 5/378 | (2011.01) |
| H04N 5/374 | (2011.01) |
| H04N 5/365 | (2011.01) |
| H04N 9/04 | (2006.01) |
| H01L 27/146 | (2006.01) |
| H04N 1/00 | (2006.01) |

(Continued)

(52) U.S. Cl.
CPC ....... *H04N 5/378* (2013.01); *H01L 27/14645* (2013.01); *H04N 5/357* (2013.01); *H04N 5/3765* (2013.01); *H04N 5/37455* (2013.01); *H04N 9/045* (2013.01)

(58) Field of Classification Search
CPC ........ H04N 5/357; H04N 5/363; H04N 5/365; H04N 5/37465; H04N 5/37455; H04N 5/378; H04N 9/045; H04N 1/00994; H01L 27/14645; H03M 1/12; H03M 1/46; H03M 1/462; H03M 1/0697; H03M 1/0854; H03M 1/34
USPC ............... 348/308, 193, 241, 243, 470, 384, 348/240.02, 384.1; 382/275; 341/144, 341/155, 164, 118, 120; 375/227, 254, 375/346, 340, 240.11, 240.02
See application file for complete search history.

(56) References Cited

U.S. PATENT DOCUMENTS 8,159,722 B2 * 4/2012 Higashima ................ G06T 5/00
358/3.26
8,773,191 B2 * 7/2014 Park ........................ H03M 1/12
327/309

(Continued)

FOREIGN PATENT DOCUMENTS

CN       1783957 A      6/2006
CN     102438109 A      5/2012

(Continued)

OTHER PUBLICATIONS

Office Action for Chinese Patent Application No. 201811157727.5 dated Dec. 10, 2020 (24 pages).

Primary Examiner — Marly S Camargo
(74) Attorney, Agent, or Firm — Perkins Coie LLP (57) ABSTRACT A comparison device includes a comparison block suitable for comparing a pixel signal with a ramp signal and outputting a comparison signal; a banding value generation block suitable for generating a banding value using a setting code value and an analog-digital conversion code value; and a control block suitable for controlling a current an input network of the comparison block according to the banding value outputted from the banding value generation block.

17 Claims, 6 Drawing Sheets (51) Int. Cl.
*H03M 1/12* (2006.01)
*H03M 1/46* (2006.01)
*H03M 1/06* (2006.01)
*H03M 1/08* (2006.01)
*H04N 5/3745* (2011.01)
*H04N 5/376* (2011.01)

(56) References Cited

U.S. PATENT DOCUMENTS

| | | | |
|---|---|---|---|
| 10,224,355 B2* | 3/2019 | Kim | H01L 27/14689 |
| | | | 341/164 |
| 10,757,356 B2* | 8/2020 | Kim | H04N 5/3658 |
| | | | 348/241 |
| 2002/0158294 A1* | 10/2002 | Fujiwara | H01L 27/14623 |
| | | | 257/431 |
| 2006/0114342 A1* | 6/2006 | Egawa | H04N 5/217 |
| | | | 348/241 |
| 2008/0055432 A1* | 3/2008 | Koseki | H04N 5/3745 |
| | | | 348/243 |
| 2014/0070974 A1* | 3/2014 | Park | H03M 1/12 |
| | | | 341/155 |

FOREIGN PATENT DOCUMENTS

| | | |
|---|---|---|
| CN | 103684460 A | 3/2014 |
| CN | 107347142 A | 11/2017 |
| JP | 4683112 | 5/2011 |
| KR | 10-1429512 | 8/2014 |

* cited by examiner

COMPARISON DEVICE AND CMOS IMAGE SENSOR INCLUDING THE SAME

CROSS-REFERENCE TO RELATED APPLICATION

This patent document claims the priority and benefits of Korean Patent Application No. 10-2018-0017463 filed on Feb. 13, 2018, which is incorporated herein by reference in its entirety.

TECHNICAL FIELD

The technology and implementations disclosed in this patent document relate to a comparison device and a complementary metal oxide semiconductor (CMOS) image sensor including the same.

BACKGROUND

The high-speed readout and low power consumption are important parameters to consider in designing CMOS image sensors. However, there is a trade-off between the high-speed readout and low power consumption. The demand for CMOS image sensors with more and more pixels leads to an increased bandwidth of readout circuitry in order to read out the increased number of pixels within a short frame of time. To facilitate the high-speed readout of large pixel array without consuming much power, therefore, a column-parallel architecture may be used.

SUMMARY

This patent document provides, among others, a comparison device and a CMOS image sensor for minimizing an influence of undesired noises such as a banding noise by providing a mechanism to offset the effects caused by the undesired noises.

Also, a comparison device which may be used in a CMOS image sensor based on the disclosed technology can be used to offset a code delay caused by the banding noise by providing a circuit for generating an offset code delay having a value opposite to the code delay caused by the banding noise.

In an embodiment, a comparison device may include a comparison block suitable for comparing a pixel signal with a ramp signal and outputting a comparison signal; a banding value generation block suitable for generating a banding value using a setting code value and an analog-digital conversion code value; and a control block suitable for controlling a current an input network of the comparison block according to the banding value outputted from the banding value generation block. In another aspect, a comparison device is provided to include a comparison circuit including input ports to receive an input signal and a ramp signal, respectively, and structured to compare the input signal with the ramp signal to output a comparison signal; a counter circuit coupled to the comparison circuit to receive the comparison signal and structured to provide a counted value of the comparison signal; a banding value generation circuit coupled to the counter circuit and structured to generate a banding value representing a difference between a predicted analog-digital conversion code value and an actual analog-digital conversion code value associated with the counted value from the counter circuit; and a control circuit coupled to the banding value generation circuit and the comparison circuit and structured to control a current flowing through an input network of the comparison circuit based on the banding value outputted from the banding value generation circuit.

In some implementations, wherein the banding value generation circuit includes: a memory structured to store the predicted analog-digital conversion code value; and a banding value generator coupled to the memory and structured to generate the banding value based on the predicted analog-digital conversion code value stored in the memory. In some implementations, the control circuit includes: a bias controller coupled to the banding value generator and structured to provide a bias voltage based on the banding value outputted from the banding value generation circuit; and a current controller coupled to the bias controller and structured to control the current of the input network of the comparison circuit based on the bias voltage outputted from the bias controller.

In some implementations, the bias controller includes a digital-analog conversion device that generates the bias voltage in proportion to the banding value outputted from the banding value generation circuit. In some implementations, the current controller controls the current of the input network of the comparison circuit by adjusting a transfer conductance of the input network of the comparison circuit based on the bias voltage outputted from the bias controller. In some implementations, the current controller includes at least one transistor that has a source terminal and a drain terminal that are coupled to the input network of the comparison circuit and a gate terminal that is coupled to the bias controller to receive the bias voltage from the bias controller. In some implementations, the current controller includes: a first transistor having a source terminal coupled to a source terminal of a first input transistor and a second input transistor of the comparison circuit, and a drain terminal coupled to a drain terminal of the first input transistor, wherein the first transistor receives the bias voltage from the bias controller through a gate terminal of the first transistor; and a second transistor having a source terminal coupled to the source terminal to the first input transistor and the second input transistor of the comparison circuit, and a drain terminal coupled to a drain terminal of the second input transistor, wherein the second transistor receives the bias voltage from the bias controller through a gate terminal of the second transistor. In some implementations, the control circuit includes: a bias controller coupled to the banding value generation circuit and structured to generate a plurality of bias voltages based on the banding value outputted from the banding value generation circuit; and a current controller coupled to the bias controller and structured to control the current of the input network of the comparison circuit based on the plurality of bias voltages from the bias controller.

In an embodiment, a comparison device may include a plurality of comparison blocks, each suitable for comparing each of a plurality of pixel signals with a ramp signal and outputting a comparison signal; and a global control block suitable for controlling a current of an input network of the plurality of comparison blocks according to a banding value provided from an external control circuit. In another aspect, a comparison device is provided to comprise: a plurality of comparison circuits, each comparison circuit including input ports to receive input signal and a ramp signal, respectively, and structured to compare the input signal with the ramp signal to output a comparison signal; and a global control circuit coupled to the plurality of comparison circuits and structured to control a current of an input network of the plurality of comparison circuits based on a banding value provided from an external control circuit.

In some implementations, the global control circuit includes: a bias controller structured to provide a bias voltage based on the banding value provided from the external control circuit; and a global current controller coupled to the bias controller and structured to control the current of the input network of the plurality of comparison circuits based on the bias voltage outputted from the bias controller. In some implementations, the bias controller includes a digital-analog conversion device that generates the bias voltage in proportion to the banding value provided from the external control circuit. In some implementations, the global current controller controls the current of the input network of the plurality of comparison circuits by adjusting a transfer conductance of the input network of the plurality of comparison circuits based on the bias voltage outputted from the bias controller. In some implementations, the global current controller includes at least one transistor that has a source terminal and a drain terminal that are coupled to the input network of the plurality of comparison circuits and a gate terminal that is coupled to the bias controller to receive the bias voltage from the bias controller, In some implementations, the global control circuit includes: a bias controller structured to generate a plurality of bias voltages based on the banding value provided from the external control circuit; and a current controller coupled to the bias controller and structured to control the current of the input network of the plurality of comparison circuits based on the plurality of bias voltages outputted from the bias controller.

In an embodiment, a CMOS image sensor may include a pixel array suitable for generating a pixel signal corresponding to incident light received at each pixel included in the pixel array; a row decoder suitable for selecting and controlling each pixel of the pixel array row by row; a ramp signal generation circuit suitable for generating a ramp signal; a comparison block suitable for comparing the ramp signal with a pixel signal and outputting a comparison signal; a banding value generation block suitable for generating a banding value using a setting code value and an analog-digital conversion code value; a control block suitable for controlling a current of an input network of the comparison block according to the banding value outputted from the banding value generation block; a counting circuit suitable for performing a counting operation based on the comparison signal; a memory circuit suitable for storing information outputted from the counter; a column read-out circuit suitable for outputting the information stored in the memory; and a control circuit suitable for controlling the row decoder, the ramp signal generation circuit, the comparison block, the counting circuit, the memory circuit and the column read-out circuit. In some implementations, the CMOS image sensor further comprises a banding value generation circuit coupled to the counting circuit and the current control circuit and structured to generate the banding value and provide the generated banding value to the current control circuit.

In another aspect, a complementary metal oxide semiconductor (CMOS) image sensor is provided to comprise: a pixel array including pixels arranged in rows and columns, each pixel structured to generate a pixel signal in response to incident light received at each pixel included in the pixel array; a row decoder suitable for selecting and controlling each pixel of the pixel array row by row; a ramp signal generation circuit suitable for generating a ramp signal; a comparison circuit coupled to the ramp signal generation circuit to receive the ramp signal and further coupled to the pixel array to receive a pixel signal from a pixel in the pixel array, the comparison circuit structured to compare the ramp signal with the pixel signal and output a comparison signal; a counting circuit coupled to the comparison circuit and structured to perform a counting operation based on the comparison signal and provide a counted value of the comparison signal; a current control circuit coupled to the comparison circuit and structured to control a current of an input network of the comparison circuit based on a banding value indicating a difference between a predicted analog-digital conversion code value and an actual analog-digital conversion code value associated with the counted value from the counting circuit; and a control circuit coupled to and operable to control the row decoder, the ramp signal generation circuit, the comparison circuit, and the counting circuit.

In an embodiment, a CMOS image sensor may include a pixel array suitable for generating a pixel signal corresponding to incident light received at each pixel included in the pixel array; a row decoder suitable for selecting and controlling each pixel of the pixel array row by row; a ramp signal generation circuit suitable for generating a ramp signal; a comparison block suitable for comparing the ramp signal with a pixel signal and outputting a comparison signal; a global control block suitable for controlling a current of an input network of the comparison block according to a banding value provided from a control circuit; a counting circuit suitable for performing a counting operation based on the comparison signal; a memory circuit suitable for storing information outputted from the counter; a column read-out circuit suitable for outputting the information stored in the memory; and the control circuit suitable for controlling the row decoder, the ramp signal generation circuit, the comparison block, the counting circuit, the memory circuit and the column read-out circuit.

In some implementations, the banding value generation circuit includes: a memory structured to store the predicted analog-digital conversion code value; and a banding value generator coupled to the memory and structured to generate the banding value based on the predicted analog-digital conversion code value stored in the memory. In some implementations, the control circuit includes: a bias controller coupled to the banding value generator and structured to provide a bias voltage based on the banding value outputted from the banding value generation circuit; and a current controller coupled to the bias controller and structured to control the current of the input network of the comparison circuit based on the bias voltage outputted from the bias controller. In some implementations, the CMOS image sensor further comprises an additional comparison circuit coupled to another column of the pixel array and the current control circuit is structured to control currents of input networks of the comparison circuit and the additional comparison circuit based on the banding value. In some implementations, the global control circuit includes a bias controller structured to provide a bias voltage based on the banding value; and a global current controller coupled to the bias controller and structured to control the currents of the input networks of the comparison circuit and the additional comparison circuit according to the bias voltage outputted from the bias controller.

DETAILED DESCRIPTION

The disclosed technology can be implemented to provide a comparison device and a complementary metal oxide semiconductor (CMOS) image sensor including the same, which can avoid the deterioration of the quality of an image obtained from the image sensor. The disclosed technology may be implemented in ways that provide a mechanism to offset or remove the effects caused by the undesired noises.

To facilitate the high-speed readout of large pixel array without consuming much power, the column-parallel ADC (analog-to-digital converter) architecture is used in the image sensor. In the column-parallel ADC architecture of the CMOS image sensor, a single-slope ADC may be used due to its relatively simple column circuit and relatively small chip area in comparison with some other types of ADCs. The column-parallel ADC architecture of the CMOS image sensor is often designed to have a layout accommodating a pitch size of a small pixel and, as a result, the spacing between column-parallel ADCs can be narrow. This narrow spacing tends to suffer from coupling noise that is caused undesired coupling between neighboring column-parallel ADCs.

In addition, the column-parallel ADC completes analog-digital conversion operations of pixel signals at different timings based on sizes of the pixel signals. This affects the analog-digital conversion operations of the column-parallel ADC through a current/voltage bias line commonly coupled to the column-parallel ADCs. As a result, undesired noises such as a banding noise occurs to cause different analog-digital conversion values every time.

For example, various types of the banding noise may occur during an image processing operation to cause a quality deterioration of an image. To reduce the undesired noises including the banding noise, many suggestions have been made on the column-parallel ADC architecture, for example, to design the column-parallel ADC in light of various circuitry considerations. However, the currently suggested approaches have problems to cause an operation speed or a power of the image sensor to change, which results in affecting a performance of the entire image sensor.

Figure 1A:
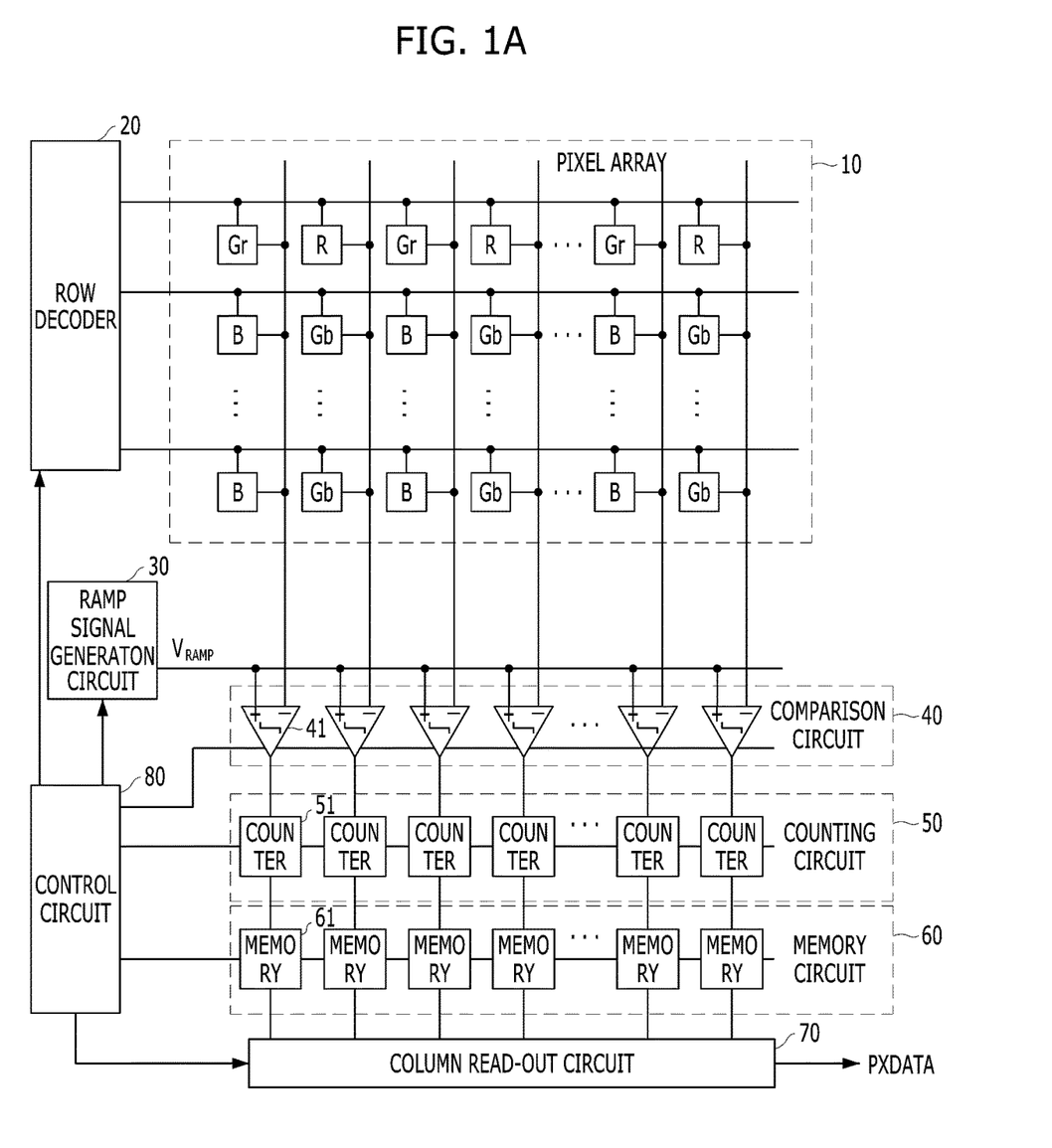
FIG. 1A is a diagram illustrating an example of a CMOS image sensor.

The implementations of the disclosed technology provide a new approach to mitigating or removing the effect caused by the undesired noise without changing the performance of the image sensor. FIG. 1A is a diagram illustrating an example of a CMOS image sensor. The CMOS image sensor shown in FIG. 1 represents a CMOS image sensor of column parallel structure using a single-slope analog-to-digital conversion device.

Referring to FIG. 1A, the CMOS image sensor includes a pixel array 10 including imaging pixels arranged in rows and columns, a row decoder 20, a ramp signal generation circuit 30, a comparison circuit 40, a counting circuit 50, a memory circuit 60, a column read-out circuit 70 and a control circuit 80.

The pixel array 10 outputs pixel signals in response to incident light at individual imaging pixels. The row decoder 20 selects and controls pixels of the pixel array row by row. The ramp signal generation circuit 30 generates a ramp signal $V_{RAMP}$ in response to a control signal of the control circuit 80. The comparison circuit 40 includes two input ports or terminals to receive an outputs pixel signal from a pixel in the pixel array 10 and a ramp signal $V_{RAMP}$ from the ramp signal generation circuit 30 and is designed to compare the ramp signal $V_{RAMP}$ from the ramp signal generation circuit 30 with each pixel signal outputted from the pixel array 10.

The counting circuit 50 may receive output signals from the comparison circuit 40 and count the number of clock pulses of the control circuit 80 based on the output signals of the comparison circuit 40. The memory circuit 60 stores information (e.g., the number of dock pulses) provided by the counting circuit 50 according to instructions provided by the control circuit 80. The column read-out circuit 70 outputs sequentially the information stored in the memory circuit 60 as a pixel data PXDATA according to instructions provided by the control circuit 80. The control circuit 80 may be coupled to the row decoder 20, the ramp signal generation circuit 30, the comparison circuit 40, the counting circuit 50, the memory circuit 60 and the column read-out circuit 70 and control operations of the row decoder 20, the ramp signal generation circuit 30, the comparison circuit 40, the counting circuit 50, the memory circuit 60 and the column read-out circuit 70.

A CMOS image sensor may include the comparison circuit 40 that utilizes a correlated double sampling CDS technique to remove an offset value of the pixel.

The comparison circuit 40 includes a plurality of comparators 41, the counting circuit 50 includes a plurality of counters 51, and the memory circuit 60 includes a plurality of memories 61. In an example configuration, each column of the pixel array 10 includes the comparator 41, the counter 51 and the memory 61.

The operations of the comparator 41, the counter 51 and the memory 61 will be described with reference to FIG. 1A as below.

The comparator 41 has two input terminals that receive a pixel signal outputted from a column of the pixel array 10 and a ramp signal $V_{RAMP}$ outputted from the ramp signal generation circuit 30, respectively. The comparator 41 compares the ramp signal $V_{RAMP}$ with the pixel signal and outputs a comparison signal in response to a control signal provided by the control circuit 80.

Since a voltage level of the ramp signal $V_{RAMP}$ increases or decreases as time passes, the ramp signal $V_{RAMP}$ crosses the pixel signal at some point in time. After this crossing point, the value of the comparison signal outputted from the comparator 41 is inverted.

The counter 51 is used to count pulses during a period of time, for example, when the pixel signal is above the ramp signal. The counter 51 is initialized by a reset control signal of the control circuit 80.

The memory 61 stores information relating to the count (e.g., number of pulses) provided by the counter 51 and outputs the information to the column read-out circuit 70 according to control signals of the control circuit 80. Here, the CMOS image sensor may perform a counting operation on a reset signal (or a reset voltage) and then perform a counting operation on an image signal (a signal voltage).

Figure 1B:
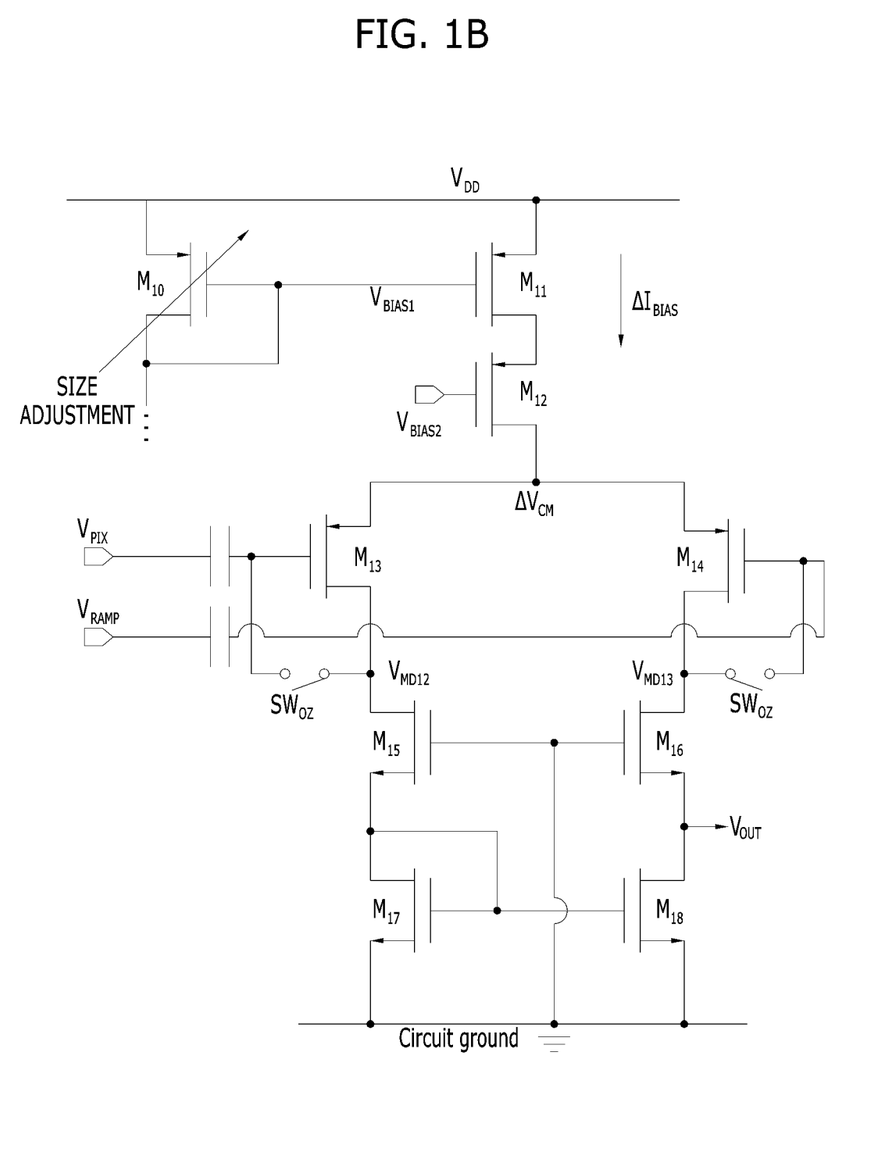
FIG. 1B is a circuit diagram illustrating an example of a comparator shown in FIG. 1A.

FIG. 1B is a circuit diagram illustrating an example of a comparator shown 41 in FIG. 1A. Since the comparator 41 shown in FIG. 1B is widely known to an ordinary person in the disclosed technology, the detailed description of the comparator 41 will be omitted except for the description regarding a basic concept of a banding noise. The banding noise is an example of the undesired noises and one of ordinary skilled in the art could understand that the implementations of the disclosed technology can be used to remove or minimize the effects by other noises than the banding noise.

As discussed above, since the banding noise may occur in various manners during an image processing operation and may cause a quality deterioration of an image, various circuitry tuning points are considered and designed in order to reduce the banding noise.

For example, as shown in FIG. 1B, in order to reduce the banding noise, a bias current $I_{BIAS}$ of a second transistor $M_{11}$ may be adjusted by adjusting a size of a first transistor $M_{10}$. However, this scheme may change a direct current (DC) bias point of the comparator.

Instead of changing the bias current $I_{BIAS}$, the disclosed technology provides some implementations including a circuit to offset or remove a code delay caused by the banding noise. The circuit provided in the disclosed technology is designed to generate an offset code delay component opposite to the code delay caused by the banding noise. Since the code delay caused by the banding noise is offset or removed by the suggested circuits, the influence of the banding noise can be minimized. In some implementations, the circuit provided in the disclosed technology is designed to generate a negative or positive banding noise depending on a value of the banding noise. For example, if a positive banding noise occurs, the circuit operates to generate a negative banding noise to remove the positive banding noise occurred. If a negative banding noise occurs, the circuit operates to generate a positive banding noise to remove the negative banding noise occurred. More detailed descriptions will be followed with reference to FIGS. 2 to 5.

Figure 2:
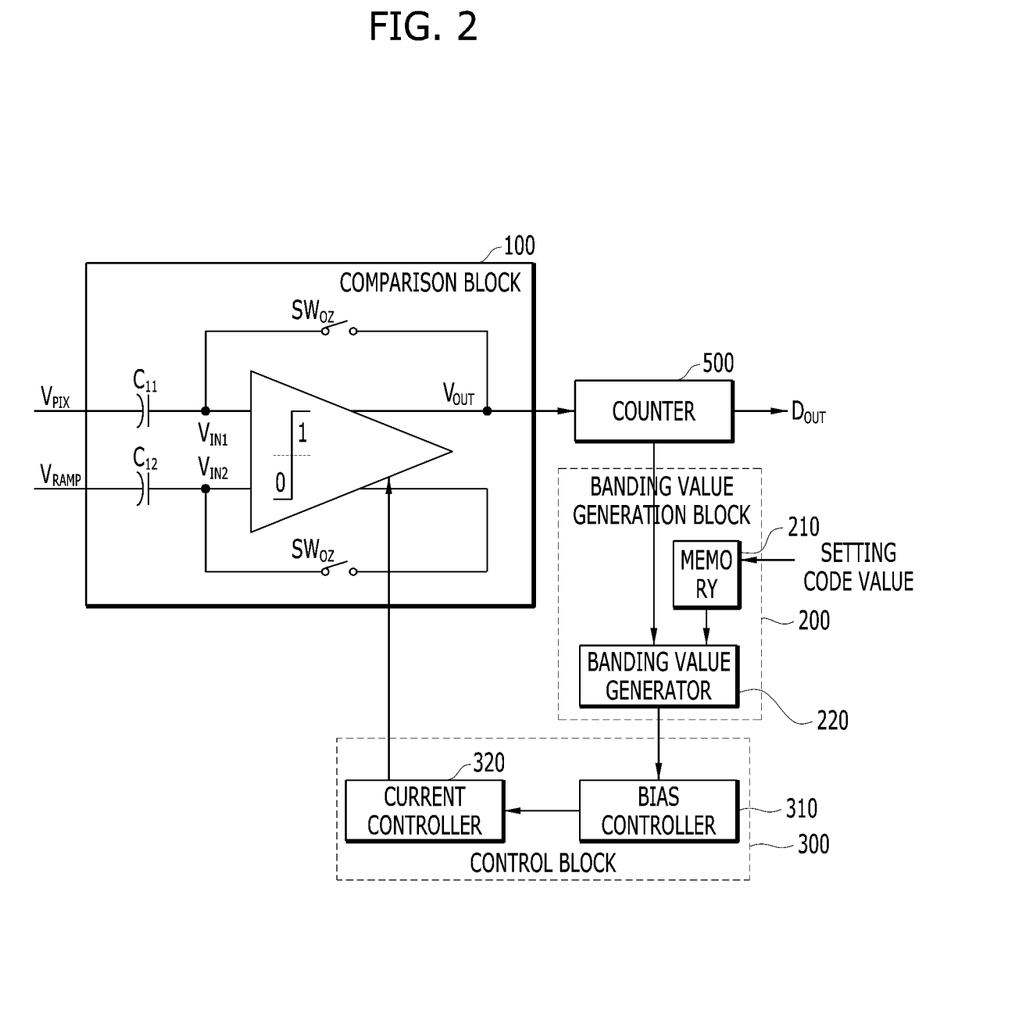
FIG. 2 is a diagram illustrating an example of a comparison device in accordance with an embodiment of the disclosed technology.

FIG. 2 is a diagram illustrating an example of a comparison device in accordance with an embodiment of the disclosed technology.

The comparison device in accordance with an embodiment of the disclosed technology includes a comparison block 100, a banding value generation block 200 and a control block 300.

The comparison block 100 compares a pixel signal $V_{PIX}$ and a ramp signal $V_{RAMP}$ and outputs a comparison signal. The banding value generation block 200 generates a banding value based on a setting code value and an analog-digital conversion code value. The control block 300 may be connected to the comparison block 100 by a common node connected to both the comparison block 100 and the control block 300. The control block 300 controls a current flowing through an input network of the comparison block 100 according to the banding value outputted from the banding value generation block 200. The input network of the comparison block 100 indicates elements through which the pixel signal $V_{PIX}$ and the ramp signal $V_{RAMP}$ are inputted to the comparison block 100.

In some implementations, the banding value generation block 200 further includes a memory 210 and a banding value generator 220.

The memory 210 stores the setting code value. The setting code value indicates a predicted analog-digital conversion value determined at the time of a circuit verification operation. The banding value generator 220 generates the banding value using a difference between the setting code value stored in the memory and the analog-digital conversion code value outputted from a counter 500.

The banding value may be set to a difference value between the actual analog-digital conversion code value, e.g., a counter code value obtained from the counter 500, and the setting code value, i.e., a predicted analog-digital conversion code value at the time of the circuit verification operation. The memory 210 presets and stores the setting code value or stores the setting code value received from an image signal processor (ISP).

The banding value generator 220 may be implemented using a conventional adding or subtraction logic.

The control block 230 includes a bias controller 310 and a current controller 320.

The bias controller 310 may be coupled to the banding value generator 220 and provide a bias voltage based on the banding value outputted from the banding value generator 220. The current controller 320 controls the current inputted to the comparison block 100 according to the bias voltage provided from the bias controller 310.

When the comparison block 100 is implemented to have multiple stages, the control block 300 may be designed to control not only the single-stage comparison block 100 but also the two-stage comparison block and the three-stage comparison block.

The bias controller 310 may be implemented using a digital-analog converter (DAC) for generating a bias voltage in proportion to the banding value, e.g., the code value, outputted from the banding value generator 220 of the banding value generation block 200. The DAC may be implemented using a capacitor heat or a resistor heat. The current controller 320 controls the current inputted to the comparison block 100 by adjusting a transfer conductance of the input network of the comparison block 100 according to the bias voltage outputted from the bias controller 310.

Figure 3:
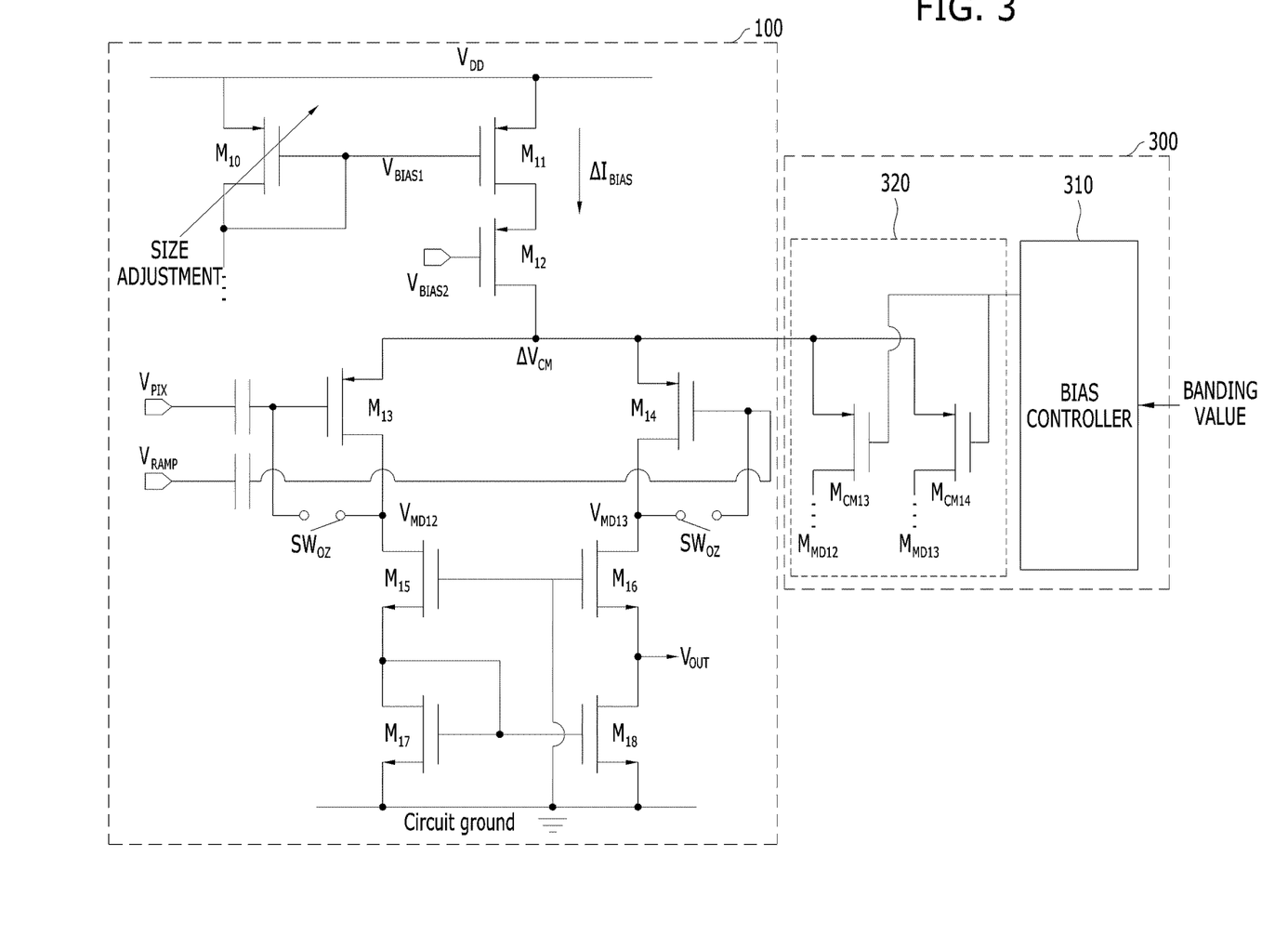
FIG. 3 is a circuit diagram illustrating an example of the comparison device shown in FIG. 2.

FIG. 3 is a circuit diagram illustrating an example of the comparison device shown in FIG. 2.

The comparison device shown in FIG. 3 includes the comparison block 100, the bias controller 310 and the current controller 320.

Since the circuit configuration of the comparison block 100 is widely known to an ordinary person in the disclosed technology, the detailed description of the comparison block 100 will be omitted.

Referring to FIG. 3, the current controller 320 of the control block 300 includes a first transistor $M_{CM13}$ and a second transistor $M_{CM14}$.

A source terminal of each of the first transistor $M_{CM13}$ and the second transistor $M_{CM14}$ is coupled to an input network of the comparison block 100. Each of the first transistor $M_{CM13}$ and the second transistor $M_{CM14}$ has a gate terminal to receive the bias voltage from the bias controller 310.

In some implementations, the source terminal of the first transistor $M_{CM13}$ is coupled to a source terminal of each of a first input transistor $M_{13}$ and a second input transistor $M_{14}$ of the input network of the comparison block 100. A drain terminal of the first transistor $M_{CM13}$ is coupled to a drain terminal of the first input transistor $M_{13}$ of the input network of the comparison block 100. The first transistor $M_{CM13}$ receives the bias voltage from the bias controller 310 through the gate terminal of the first transistor $M_{CM13}$.

The source terminal of the second transistor $M_{CM14}$ is coupled to a source terminal of each of the first input transistor $M_{13}$ and the second input transistor $M_{14}$ of the input network of the comparison block 100. A drain terminal of the second transistor $M_{CM14}$ is coupled to a drain terminal of the second input transistor $M_{14}$ of the input network of the comparison block 100. The second transistor $M_{CM14}$ receives the bias voltage from the bias controller 310 through the gate terminal of the second transistor $M_{CM14}$.

Although it has been described in FIG. 3 that the current controller 320 is implemented using two transistors $M_{CM13}$ and $M_{CM14}$, the current controller 320 can be implemented using a single transistor or at least three transistors.

As described above, the current controller 320 is coupled to the input network of the comparison block 100 including the first input transistor M13 and the second input transistor M14, and adjusts a transfer conductance of the input network of the comparison block 100 based on the bias voltage from the bias controller 310 which changes based on the banding value outputted from the banding value generation block 200. A gain of the comparison block 100 is changed by adjusting the conductance of the input network of the comparison block 100. An offset code delay occurs by changing the gain of the comparison block 100 which can offset or remove the code delay caused by the banding noise.

Thus, in embodiments of the disclosed technology, the banding value generation block 200 generates the banding value having an element opposite to the noise element such as a banding noise, and the ADC adjusts the transfer conductance of the input network of the comparison block 100 based on the banding value outputted from the banding value generation block 200. Thus, the code delay caused by the banding noise can be removed.

Referring to FIG. 3, a configuration and an operation of the comparison device in accordance with an embodiment of the disclosed technology will be described in details as below.

The control block 300 includes the current controller 320 and the bias controller 310. The current controller 320 includes the first transistor $M_{CM13}$ and the second transistor $M_{CM14}$, which are coupled in parallel to the input network having the first input transistor $M_{13}$ and the second input transistor $M_{14}$. The bias controller 310 receives the banding value from the banding value generation block 200 and controls the bias voltage of the current controller 320.

A drain voltage $V_{MD12}$ of the first input transistor $M_{13}$ and a drain voltage $V_{MD13}$ of the second input transistor $M_{14}$ are provided to the drain terminal of the first transistor $M_{CM13}$ and the second transistor $M_{14}$, respectively. The gate terminal of the first transistor $M_{CM13}$ and the gate terminal of the second transistor $M_{CM14}$ are commonly coupled to the bias controller 310.

The bias controller 310, which receives the band value from the banding value generation block 200, controls the transfer conductance of the input network having the first input transistor $M_{13}$ and the second input transistor $M_{14}$. The code delay is generated by controlling the transfer conductance of the input network of the comparison block 100 and changing the gain of the comparison block 100.

As compared with a structure of the comparator shown in FIG. 1B, the bias current $I_{BIAS}$ flows on only the first input transistor $M_{13}$ and the second input transistor $M_{14}$, and determines the transfer conductance of the input network. Thus, the common voltage $V_{CM}$ is determined.

In case of the comparison device in accordance with an embodiment of the disclosed technology, the comparison block 100 is coupled to the current controller 320 including the first input transistor $M_{13}$ and the second input transistor $M_{14}$ such that the bias current $I_{BIAS}$ flows on the first transistor $M_{CM13}$ and the second transistor $M_{CM14}$ of the comparison block as well as the first input transistor $M_{13}$ and the second input transistor $M_{14}$ according to the control of the gate terminal voltage of the first transistor $M_{CM13}$ and the second transistor $M_{CM14}$ by the bias controller 310. Due to the change of the gate terminal voltage of the first transistor $M_{CM13}$ and the second transistor $M_{CM14}$, the variation $\Delta V_{CM}$ of the common voltage $V_{CM}$ occurs, and the size of the transfer conductance of the input network of the comparison block 100 is changed. By changing the transfer conductance of the input network of the comparison block 100, the gain of the comparison block 100 is adjusted or changed, and the associated offset code delay occurs during the analog-digital conversion operation.

For example, if the bias controller 310 increases the gate terminal voltage of the first transistor $M_{CM13}$ and the second transistor $M_{CM14}$, the current, which flows on the first transistor $M_{CM13}$ and the second transistor $M_{CM14}$, is decreased. Thus, the common voltage is increased and the transfer conductance of the first transistor $M_{CM13}$ and the second transistor $M_{CM14}$ is increased.

If the bias controller 310 decreases the gate terminal voltage of the first transistor $M_{CM13}$ and the second transistor $M_{CM14}$, the current, which flows on the first transistor $M_{CM13}$ and the second transistor $M_{CM14}$, is increased. Thus, the common voltage is decreased and the transfer conductance of the first transistor $M_{CM13}$ and the second transistor $M_{CM14}$ is decreased. Through this process, the gain of the comparison block is changed.

Meanwhile, the gate terminal voltage of the first transistor $M_{CM13}$ and the gate terminal voltage of the second transistor $M_{CM14}$ are controlled to have a same voltage level as shown in FIG. 3, but the gate terminal voltage of the first transistor $M_{CM13}$ and the gate terminal voltage the second transistor $M_{CM14}$ may be separately controlled to have different voltage levels.

For example, the bias controller 310, which receives the banding value from the banding value generation block 200, may be implemented to generate and provide two bias voltages to the gate terminal of the first transistor $M_{CM13}$ and the gate terminal of the second transistor $M_{CM14}$, respectively.

Figure 4:
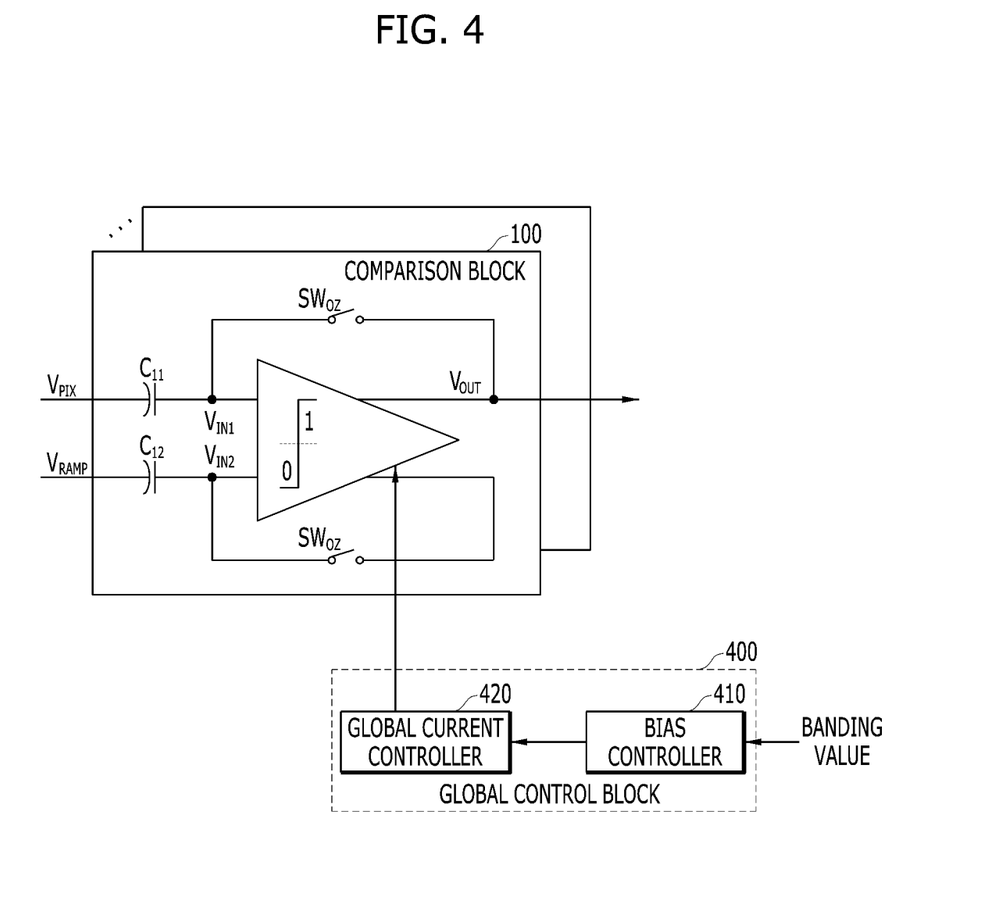
FIG. 4 is a diagram illustrating an example of a comparison device in accordance with another embodiment of the disclosed technology.

FIG. 4 is a diagram illustrating an example of a comparison device in accordance with another embodiment of the disclosed technology.

Referring to FIG. 4, a comparison device in accordance with another embodiment of the disclosed technology includes a plurality of comparison blocks 100 and a global control block 400.

Each of the plurality of comparison blocks 100 compares each of the pixel signals $V_{PIX}$ with the ramp signal $V_{RAMP}$, and outputs a comparison signal. The details descriptions of each of the plurality of comparison blocks 100 will be omitted since each of the plurality of comparison blocks 100 shown in FIG. 4 is same as the comparison block 100 shown in FIG. 2.

The global control block 400 controls the current of the input network of the plurality of comparison blocks 100 according to a banding value provided from an external control circuit.

The global control block 400 includes a bias controller 410 and a global current controller 420.

The bias controller 410 controls a bias voltage according to the band value provided from the external control circuit.

The global current controller 420 controls the current of the input network of the plurality of comparison blocks according to the bias voltage control of the bias controller 410.

Unlike the control block 300 shown in FIG. 2 that is connected to control the comparison block 100 of a single column of the pixel array, the global current controller 420 is connected to control the comparison blocks of the multiple columns of the pixel array. Thus, if the pixel array has a narrow column pitch and it is difficult to have the comparison block shown in FIG. 2, the comparison device including the global control block 400 as shown in FIG. 4 can be implemented for controlling the comparison blocks of the multiple columns of the pixel array as shown in FIG. 4.

For the implementation as shown in FIG. 4, a banding value generation block (not shown) corresponding to the banding value generation block 200 of FIG. 2 may be provided in the external control circuit, e.g., an image signal processor (ISP). Thus, the external control circuit may perform a banding value generation calculation, and the global control block 400 may receive the banding value from the external control circuit.

Figure 5:
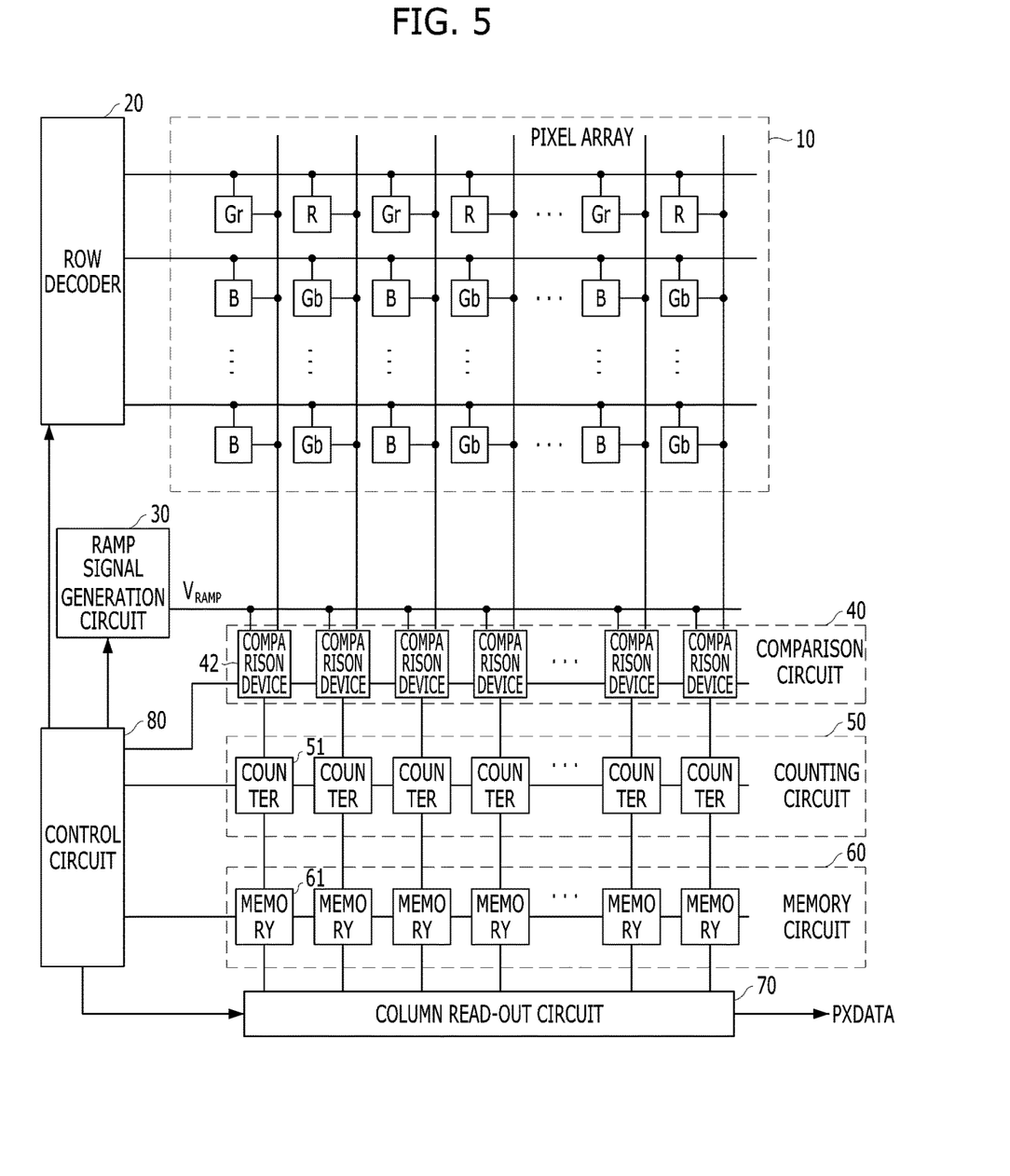
FIG. 5 is a diagram illustrating an example of a CMOS image sensor including a comparison device in accordance with embodiments of the disclosed technology.

FIG. 5 is a diagram illustrating an example of a CMOS image sensor including a comparison device in accordance with embodiments of the disclosed technology.

Referring to FIG. 5, the CMOS image sensor in accordance with embodiments of the disclosed technology includes a pixel array 10, a row decoder 20, a ramp signal generation circuit 30, a comparison circuit 40, a counting circuit 50, a memory circuit 60, a column read-out circuit 70 and a control circuit 80.

The pixel array 10 outputs pixel signals in response to incident light. The row decoder 20 selects and controls pixels of the pixel array row by row. The ramp signal generation circuit 30 generates a ramp signal $V_{RAMP}$ (including a coarse ramping signal and a fine ramping signal) in response to a control signal of the control circuit. The comparison circuit 40 compares the ramp signal $V_{RAMP}$ of the ramp signal generation circuit 40 with each pixel signal outputted from the pixel array.

The counting circuit 50 counts the number of clock pulses of the control circuit 80 according to output signals of the comparison circuit 40. The memory circuit 60 stores information (e.g., the number of clock pulses) provided by the counting circuit 50 according to instructions provided by the control circuit 80. The column read-out circuit 70 outputs sequentially the information stored in the memory circuit 60 as a pixel data PXDATA according to instructions provided by the control circuit 80. The control circuit 80 controls operations of the row decoder 20, the ramp signal generation circuit 30, the comparison circuit 40, the counting circuit 50, the memory circuit 60 and the column read-out circuit 70.

Here, the comparison circuit 40 includes the comparison device 42, which is implemented using the comparison device shown in FIG. 2 or the comparison device shown in FIG. 4 in accordance with embodiments of the disclosed technology.

A comparison device and a CMOS image sensor including the same in accordance with embodiments of the disclosed technology minimize the influence of the code delay caused by the undesired noises such as the banding noise by offsetting or removing the code delay caused by the undesired noises.

Although various embodiments and specific examples have been described, various changes and modifications may be made based on what is described and illustrated.

What is claimed is:
1. A comparison device, comprising:
a comparison circuit including input ports to receive an input signal and a ramp signal, respectively, and structured to compare the input signal with the ramp signal to output a comparison signal;
a counter circuit coupled to the comparison circuit to receive the comparison signal and structured to provide a counted value of the comparison signal;
a banding value generation circuit coupled to the counter circuit and structured to generate a banding value representing a difference between a predicted analog-digital conversion code value and an actual analog-digital conversion code value associated with the counted value from the counter circuit; and
a control circuit coupled to the banding value generation circuit and the comparison circuit and structured to control a current flowing through an input network of the comparison circuit based on the banding value outputted from the banding value generation circuit,
wherein the control circuit includes a bias controller coupled to the banding value generator and structured to provide a bias voltage based on the banding value outputted from the banding value generation circuit, and
wherein the bias controller includes a digital-analog conversion device that generates the bias voltage in proportion to the banding value outputted from the banding value generation circuit.

2. The comparison device of claim 1, wherein the banding value generation circuit includes:
a memory structured to store the predicted analog-digital conversion code value; and
a banding value generator coupled to the memory and structured to generate the banding value based on the predicted analog-digital conversion code value stored in the memory.

3. The comparison device of claim 2, wherein the control circuit further includes:
a current controller coupled to the bias controller and structured to control the current of the input network of the comparison circuit based on the bias voltage outputted from the bias controller.

4. The comparison device of claim 3, wherein the current controller controls the current of the input network of the comparison circuit by adjusting a transfer conductance of the input network of the comparison circuit based on the bias voltage outputted from the bias controller.

5. The comparison device of claim 3, wherein the current controller includes at least one transistor that has a source terminal and a drain terminal that are coupled to the input network of the comparison circuit and a gate terminal that is coupled to the bias controller to receive the bias voltage from the bias controller.

6. The comparison device of claim 3, wherein the current controller includes:
a first transistor having a source terminal coupled to a source terminal of a first input transistor and a second input transistor of the comparison circuit, and a drain terminal coupled to a drain terminal of the first input transistor, wherein the first transistor receives the bias voltage from the bias controller through a gate terminal of the first transistor; and
a second transistor having a source terminal coupled to the source terminal to the first input transistor and the second input transistor of the comparison circuit, and a drain terminal coupled to a drain terminal of the second input transistor, wherein the second transistor receives the bias voltage from the bias controller through a gate terminal of the second transistor.

7. The comparison device of claim 1, wherein
the bias controller is further structured to generate an additional bias voltage, and wherein the control circuit further includes a current controller coupled to the bias controller and structured to control the current of the input network of the comparison circuit based on the bias voltage and the additional bias voltage from the bias controller.

8. A comparison device, comprising:
a plurality of comparison circuits, each comparison circuit including input ports to receive input signal and a ramp signal, respectively, and structured to compare the input signal with the ramp signal to output a comparison signal; and
a global control circuit coupled to the plurality of comparison circuits and structured to control a current of an input network of the plurality of comparison circuits based on a banding value provided from an external control circuit,
wherein the banding value represents a difference between a predicted analog-digital conversion code value and an actual analog-digital conversion code value associated with a counted value from a counter circuit,
wherein the global control circuit includes a bias controller structured to provide a bias voltage based on the banding value provided from the external control circuit, and
wherein the bias controller includes a digital-analog conversion device that generates the bias voltage in proportion to the banding value provided from the external control circuit.

9. The comparison device of claim 8, wherein the global control circuit further includes:
a global current controller coupled to the bias controller and structured to control the current of the input network of the plurality of comparison circuits based on the bias voltage outputted from the bias controller.

10. The comparison device of claim 9, wherein the global current controller controls the current of the input network of the plurality of comparison circuits by adjusting a transfer conductance of the input network of the plurality of comparison circuits based on the bias voltage outputted from the bias controller.

11. The comparison device of claim 9, wherein the global current controller includes at least one transistor that has a source terminal and a drain terminal that are coupled to the input network of the plurality of comparison circuits and a gate terminal that is coupled to the bias controller to receive the bias voltage from the bias controller.

12. The comparison device of claim 8, wherein
the bias controller is further structured to generate an additional bias voltage, and
wherein the global control circuit further includes a current controller coupled to the bias controller and structured to control the current of the input network of the plurality of comparison circuits based on the bias voltage and the additional bias voltage that are outputted from the bias controller.

13. A complementary metal oxide semiconductor (CMOS) image sensor, comprising:
a pixel array including pixels arranged in rows and columns, each pixel structured to generate a pixel signal in response to incident light received at each pixel included in the pixel array;
a row decoder suitable for selecting and controlling each pixel of the pixel array row by row;
a ramp signal generation circuit suitable for generating a ramp signal;
a comparison circuit coupled to the ramp signal generation circuit to receive the ramp signal and further coupled to the pixel array to receive a pixel signal from a pixel in the pixel array, the comparison circuit structured to compare the ramp signal with the pixel signal and output a comparison signal;
a counting circuit coupled to the comparison circuit and structured to perform a counting operation based on the comparison signal and provide a counted value of the comparison signal;
a current control circuit coupled to the comparison circuit and structured to control a current of an input network of the comparison circuit based on a banding value indicating a difference between a predicted analog-digital conversion code value and an actual analog-digital conversion code value associated with the counted value from the counting circuit;
a control circuit coupled to and operable to control the row decoder, the ramp signal generation circuit, the comparison circuit, and the counting circuit; and
an additional comparison circuit coupled to another column of the pixel array and the current control circuit is structured to control currents of input networks of the comparison circuit and the additional comparison circuit based on the banding value.

14. The CMOS image sensor of claim 13, further comprising: a banding value generation circuit coupled to the counting circuit and the current control circuit and structured to generate the banding value and provide the generated banding value to the current control circuit.

15. The CMOS image sensor of claim 14, wherein the banding value generation circuit includes:
a memory structured to store the predicted analog-digital conversion code value; and
a banding value generator coupled to the memory and structured to generate the banding value based on the predicted analog-digital conversion code value stored in the memory.

16. The CMOS image sensor of claim 14, wherein the control circuit includes:
a bias controller coupled to the banding value generator and structured to provide a bias voltage based on the banding value outputted from the banding value generation circuit; and
a current controller coupled to the bias controller and structured to control the current of the input network of the comparison circuit based on the bias voltage outputted from the bias controller.

17. The CMOS image sensor of claim 13, wherein the global control circuit includes
a bias controller structured to provide a bias voltage based on the banding value; and
a global current controller coupled to the bias controller and structured to control the currents of the input networks of the comparison circuit and the additional comparison circuit according to the bias voltage outputted from the bias controller.

* * * * *